United States Patent
Huang et al.

(10) Patent No.: US 6,794,311 B2
(45) Date of Patent: Sep. 21, 2004

(54) METHOD AND APPARATUS FOR TREATING LOW K DIELECTRIC LAYERS TO REDUCE DIFFUSION

(75) Inventors: Kegang Huang, Fremont, CA (US); Judy H Huang, Los Gatos, CA (US); Ping Xu, Fremont, CA (US)

(73) Assignee: Applied Materials Inc., Santa Clara, CA (US)

( * ) Notice: Subject to any disclaimer, the term of this patent is extended or adjusted under 35 U.S.C. 154(b) by 2 days.

(21) Appl. No.: 09/902,518

(22) Filed: Jul. 10, 2001

(65) Prior Publication Data

US 2002/0016085 A1 Feb. 7, 2002

Related U.S. Application Data

(60) Provisional application No. 60/218,407, filed on Jul. 14, 2000.

(51) Int. Cl.[7] .......................... H01L 21/31; H01L 21/469
(52) U.S. Cl. .......................... 438/761; 438/931; 438/597
(58) Field of Search .................................. 438/761, 931, 438/597, 624, 763, 780, 781, 787, 788, 623, 626, 637, 627, 758, 769, 445, 660, 636, 691, 612

(56) References Cited

U.S. PATENT DOCUMENTS

| | | | |
|---|---|---|---|
| 3,510,369 A | 5/1970 | Ernick et al. | 148/187 |
| 4,028,155 A | 6/1977 | Jacob | 156/643 |
| 4,262,631 A | 4/1981 | Kibacki | 118/723 |
| 4,308,089 A | 12/1981 | Iida et al. | 156/643 |
| 4,420,386 A | 12/1983 | White | 204/192 |
| 4,510,178 A | 4/1985 | Paulson et al. | 437/94 |
| 4,532,150 A | 7/1985 | Endo et al. | 427/39 |
| 4,634,496 A | 1/1987 | Mase et al. | 156/643 |
| 4,634,601 A | 1/1987 | Hamakawa et al. | 427/39 |
| 4,711,698 A | 12/1987 | Douglas | 156/643 |

(List continued on next page.)

FOREIGN PATENT DOCUMENTS

| | | | |
|---|---|---|---|
| DE | 39 07 857 C1 | 5/1990 | C23C/16/32 |
| DE | 19521150 A1 | 12/1995 | H01L/23/522 |
| DE | 19654737 A1 | 7/1997 | |
| DE | 19751785 A1 | 5/1998 | H01L/21/768 |
| DE | 197 02 124 A1 | 7/1998 | B01J/19/08 |
| DE | 197 17 698 A1 | 10/1998 | H05K/3/26 |
| EP | 0 194 652 | 9/1986 | C23C/14/06 |
| EP | 0070 715 B1 | 3/1987 | G03G/5/082 |
| EP | 0416400 A1 | 3/1991 | C23C/16/44 |
| EP | 0430303 A2 | 6/1991 | H01L/21/285 |

(List continued on next page.)

OTHER PUBLICATIONS

Quan et al, Significant improvement of electrical and thermal properties of low dielectric constant plasma polymerized paraxylene thin films by postdeposition H2+He plasma treatment, Journal of Applied Physics, vol. 89, No. 2; Jan. 2001, pp. 1402–1404.*

(List continued on next page.)

*Primary Examiner*—Michael Lebentritt
(74) *Attorney, Agent, or Firm*—Moser, Patterson & Sheridan

(57) ABSTRACT

Methods and apparatus for depositing low dielectric constant layers that are resistant to oxygen diffusion and have low oxygen contents are provided. The layers may be formed by exposing a low dielectric constant layer to a plasma of an inert gas to densify the low dielectric constant layer, by exposing the low dielectric constant layer to a nitrating plasma to form a passivating nitride surface on the layer, or by depositing a thin passivating layer on the low dielectric constant layer to reduce oxygen diffusion therein. The low dielectric constant layer may be deposited and treated in situ.

29 Claims, 5 Drawing Sheets

U.S. PATENT DOCUMENTS

| | | | |
|---|---|---|---|
| 4,759,947 A | 7/1988 | Ishihara et al. .............. 427/38 |
| 4,872,947 A | 10/1989 | Wang et al. ................. 156/643 |
| 4,895,734 A | 1/1990 | Yoshida et al. ............... 427/38 |
| 4,951,601 A | 8/1990 | Maydan et al. ............. 118/719 |
| 4,980,196 A | 12/1990 | Yasuda et al. ................ 427/38 |
| 4,994,410 A | 2/1991 | Sun et al. .................... 437/192 |
| 5,000,113 A | 3/1991 | Wang et al. ................. 118/723 |
| 5,000,819 A | 3/1991 | Pedder et al. ................ 156/643 |
| 5,011,706 A | 4/1991 | Tarhay et al. .................. 427/39 |
| 5,043,299 A | 8/1991 | Chang et al. ................ 437/192 |
| 5,086,014 A | 2/1992 | Miyata et al. ............... 437/103 |
| 5,121,706 A | 6/1992 | Nichols et al. ............. 118/719 |
| 5,232,871 A | 8/1993 | Ho .............................. 437/190 |
| 5,232,872 A | 8/1993 | Ohba .......................... 437/192 |
| 5,238,866 A | 8/1993 | Bolz et al. ................... 437/100 |
| 5,248,636 A | 9/1993 | Davis et al. ................. 437/225 |
| 5,266,154 A | 11/1993 | Tatsumi ...................... 156/643 |
| 5,360,491 A | 11/1994 | Carey et al. ................. 136/256 |
| 5,401,613 A | 3/1995 | Brewer et al. .............. 430/323 |
| 5,409,543 A | 4/1995 | Panitz et al. .................... 134/2 |
| 5,423,941 A | 6/1995 | Komura et al. ........... 156/643.1 |
| 5,424,246 A | 6/1995 | Matsuo et al. ............... 437/192 |
| 5,427,621 A | 6/1995 | Gupta ............................ 134/1 |
| 5,451,263 A | 9/1995 | Linn et al. .................... 134/1.1 |
| 5,458,907 A | 10/1995 | Ishido .......................... 427/96 |
| 5,465,680 A | 11/1995 | Loboda ........................ 117/84 |
| 5,468,978 A | 11/1995 | Dowben ...................... 257/258 |
| 5,476,182 A | 12/1995 | Ishizuka et al. ............... 216/68 |
| 5,480,300 A | 1/1996 | Okoshi et al. ............... 432/241 |
| 5,512,512 A | 4/1996 | Isobe ........................... 437/187 |
| 5,527,718 A | 6/1996 | Seita et al. ..................... 437/11 |
| 5,531,862 A | 7/1996 | Otsubo et al. ........... 156/643.1 |
| 5,545,592 A | 8/1996 | Iacoponi ..................... 437/200 |
| 5,560,778 A * | 10/1996 | Park et al. ............... 118/723 E |
| 5,565,084 A | 10/1996 | Lee et al. .................... 205/646 |
| 5,572,072 A | 11/1996 | Lee ............................. 257/751 |
| 5,591,566 A | 1/1997 | Ogawa ........................ 430/325 |
| 5,607,542 A | 3/1997 | Wu et al. ................. 156/643.1 |
| 5,627,105 A | 5/1997 | Delfino et al. .............. 438/627 |
| 5,641,607 A | 6/1997 | Ogawa et al. ........... 430/272.1 |
| 5,643,834 A | 7/1997 | Harada et al. ............... 437/210 |
| 5,652,166 A | 7/1997 | Sun et al. ...................... 437/56 |
| 5,656,337 A | 8/1997 | Park et al. ................... 427/529 |
| 5,658,834 A | 8/1997 | Dowben ...................... 438/478 |
| 5,660,682 A | 8/1997 | Zhao et al. .................. 438/715 |
| 5,674,373 A | 10/1997 | Negrerie et al. ............. 205/160 |
| 5,691,209 A | 11/1997 | Liberkowski ................... 437/7 |
| 5,710,067 A | 1/1998 | Foote et al. ................. 437/238 |
| 5,711,987 A | 1/1998 | Bearinger et al. ............. 427/7 |
| 5,725,938 A | 3/1998 | Jin et al. ..................... 428/210 |
| 5,726,097 A | 3/1998 | Yanagida .................... 438/622 |
| 5,730,792 A | 3/1998 | Camilletti et al. ..... 106/287.14 |
| 5,736,002 A | 4/1998 | Allen et al. .............. 156/628.1 |
| 5,741,626 A | 4/1998 | Jain et al. .................... 430/314 |
| 5,776,235 A | 7/1998 | Camilletti et al. ........ 106/287.1 |
| 5,779,807 A | 7/1998 | Dornfest et al. ............. 134/1.2 |
| 5,780,163 A | 7/1998 | Camilletti et al. ........... 428/446 |
| 5,789,316 A | 8/1998 | Lu ............................... 438/637 |
| 5,789,776 A | 8/1998 | Lancaster et al. ........... 257/296 |
| 5,790,365 A | 8/1998 | Shel ............................ 361/234 |
| 5,801,098 A | 9/1998 | Fiordalice et al. ........... 438/653 |
| 5,817,579 A | 10/1998 | Ko et al. ..................... 438/740 |
| 5,818,071 A | 10/1998 | Loboda et al. ................ 257/77 |
| 5,821,603 A | 10/1998 | Puntambekar ............... 257/642 |
| 5,827,785 A | 10/1998 | Bhan et al. .................. 438/784 |
| 5,834,371 A | 11/1998 | Ameen et al. ............... 438/656 |
| 5,843,847 A | 12/1998 | Pu et al. ...................... 438/723 |
| 5,849,135 A | 12/1998 | Selwyn ....................... 156/345 |
| 5,869,147 A | 2/1999 | Konig ......................... 427/537 |
| 5,869,396 A | 2/1999 | Pan et al. .................... 438/647 |
| 5,876,891 A | 3/1999 | Takimoto et al. .............. 430/71 |
| 5,877,087 A | 3/1999 | Mosely et al. ............... 438/656 |
| 5,899,720 A | 5/1999 | Mikagi ........................ 438/303 |
| 5,950,083 A | 9/1999 | Inoue et al. .................. 438/233 |
| 5,970,378 A | 10/1999 | Shue et al. ................... 438/656 |
| 6,004,631 A | 12/1999 | Mori ........................... 427/534 |
| 6,004,705 A | 12/1999 | Masaki et al. ................. 430/15 |
| 6,033,537 A | 3/2000 | Suguro ..................... 204/192.2 |
| 6,054,206 A | 4/2000 | Mountsier ................ 428/312.8 |
| 6,107,192 A | 8/2000 | Subrahmanyan et al. .... 438/637 |
| 6,125,859 A | 10/2000 | Kao et al. ..................... 134/1.1 |
| 6,140,226 A | 10/2000 | Grill et al. ................... 438/637 |
| 6,147,009 A | 11/2000 | Grill et al. ................... 438/780 |
| 6,153,512 A * | 11/2000 | Chang et al. ................ 438/624 |
| 6,159,871 A | 12/2000 | Loboda et al. .............. 438/786 |
| 6,251,775 B1 | 6/2001 | Armbrust et al. ........... 438/644 |
| 6,255,732 B1 * | 7/2001 | Yokoyama et al. .......... 257/760 |
| 6,284,644 B1 * | 9/2001 | Aug et al. .................... 438/623 |
| 6,284,657 B1 * | 9/2001 | Chooi et al. ................. 438/637 |
| 6,335,274 B1 * | 1/2002 | Wu et al. ..................... 438/626 |
| 6,355,571 B1 | 3/2002 | Huang et al. ................ 438/706 |
| 6,365,527 B1 * | 4/2002 | Yang et al. .................. 438/761 |
| 6,373,076 B1 * | 4/2002 | Alok et al. .................. 257/109 |
| 6,403,464 B1 * | 6/2002 | Chang ......................... 438/623 |
| 6,407,013 B1 * | 6/2002 | Li et al. .................. 427/249.15 |
| 6,444,568 B1 | 9/2002 | Sundararajan et al. ...... 438/627 |
| 6,451,687 B1 * | 9/2002 | Liu et al. ..................... 438/624 |
| 6,465,372 B1 | 10/2002 | Xia et al. ..................... 438/787 |
| 6,486,042 B2 | 11/2002 | Gehrke et al. ............... 438/462 |
| 6,514,850 B2 | 2/2003 | Xia et al. ..................... 438/622 |
| 6,528,432 B1 | 3/2003 | Ngo et al. .................... 438/780 |
| 6,537,733 B2 | 3/2003 | Nemani et al. .............. 430/313 |
| 6,583,497 B2 | 6/2003 | Xia et al. ..................... 257/642 |
| 6,642,157 B2 | 11/2003 | Shioya et al. ................ 438/789 |
| 2002/0016085 A1 | 2/2002 | Huang et al. ................ 438/798 |
| 2002/0054962 A1 | 5/2002 | Huang ......................... 427/533 |
| 2002/0182894 A1 | 12/2002 | Andideh ...................... 438/796 |
| 2003/0186000 A1 | 10/2003 | Li et al. ....................... 427/578 |

FOREIGN PATENT DOCUMENTS

| | | | |
|---|---|---|---|
| EP | 0520519 A1 | 12/1992 | ............ H01J/37/32 |
| EP | 0553961 A2 | 8/1993 | ......... H01L/21/311 |
| EP | 0 613 178 A2 | 2/1994 | ........... H01L/21/90 |
| EP | 0 630 989 | 12/1994 | ........... C23C/16/44 |
| EP | 0 684 671 A1 | 11/1995 | ........... H01S/3/025 |
| EP | 0725440 A2 | 8/1996 | ......... H01L/23/532 |
| EP | 0776037 A2 | 5/1997 | ......... H01L/21/768 |
| EP | 0 780 485 A1 | 6/1997 | .......... C23C/14/02 |
| EP | 0 785 475 A2 | 7/1997 | .......... G03G/5/082 |
| EP | 0849779 A2 | 6/1998 | ......... H01L/21/306 |
| EP | 1 037 275 | 9/2000 | ......... H01L/21/768 |
| FR | 2712119 | 5/1995 | ......... H01L/21/306 |
| FR | 2 775 986 | 9/1999 | ............. C23F/1/12 |
| GB | 2 155 862 | 10/1985 | .......... C23C/16/44 |
| GB | 2283461 A | 5/1995 | ........... C04B/41/53 |
| GB | 2290166 A | 12/1995 | ....... H01L/21/3213 |
| GB | 2 315 158 A | 1/1998 | |
| GB | 2319532 A | 5/1998 | ........... C23C/14/58 |
| GB | 2319533 A | 5/1998 | ........... C23C/14/58 |
| JP | 61000579 | 1/1986 | ........... C23C/16/50 |
| JP | 61-009579 | 1/1986 | .......... C23C/22/00 |
| JP | 62 158 859 | 7/1987 | |
| JP | 4-72724 | 6/1992 | |
| JP | 04273442 | 9/1992 | |
| JP | 05235541 | 9/1993 | ............. H05K/3/38 |
| JP | 06097111 | 4/1994 | ............ H01L/21/28 |
| JP | 06-204191 | 7/1994 | ......... H01L/21/302 |
| JP | 06204191 | 7/1994 | ......... H01L/21/302 |
| JP | 07021749 | 8/1995 | ......... H01L/21/205 |
| JP | 07201738 | 8/1995 | ......... H01L/21/205 |
| JP | 11-16912 | 1/1999 | ................ 438/115 |

| | | | |
|---|---|---|---|
| JP | 11-162969 | * 6/1999 | |
| WO | WO 93/17453 | 9/1993 | ......... H01L/21/306 |
| WO | WO 99/33102 | 7/1998 | ......... H01L/21/767 |
| WO | 01/01472 | 1/2001 | ......... H01L/21/312 |

OTHER PUBLICATIONS

Youngsoo P., et al., Institute of Electrical Engineers, "Endothermic reactions between mullite and silicon carbide in an argon plasma environment," Journal of American Ceramic Society, USA, Jan. 1988, American Ceramic Soc., USA, vol. 81, No 1, pp. 233–236, XP-002201865.

Tremblay, Marc, et al., "Hexagonal Sensor with Imbedded Analog Image Processing for Pattern Recognition," Custom Integrated Circuits Conference, May 9, 1993, pp. 12701–12704, XP-000409694.

Partial European Search Report from EP 00 10 9917, dated Jul. 3, 2002.

U.S. patent application, Ser. No.: 09/657,392, Filing Date: Sep. 8, 2000.

U.S. patent application, Ser. No.: 09/627,667, Filing Date: Jul. 28, 2000.

U.S. patent application, Ser. No.: 09/336,525, Filing Date: Jun. 18, 1999.

PCT International Search Report dated Apr., 6, 2000.

Omar M., "Elementary Solid State Physics: Principles and Applications", pp. 124–125 (1975).

A Darchen, R Drissi–Daoudi, A Irzho, "Electrochemical Investigations of Copper Etching by Cu $(NH_3)_4$ $Cl_2$ in Ammoniacal Solutions", Journal of Applied Electrochemistry, 1997, 27 (4).

S. S. Wong, C. G. Sodini, T. W. Ekstedt, H. R. Grinolds, K. H. Jackson, and S. H. Kwan, "Low Pressure Nitrided–Oxide as a Thin Gate Dielectric for MOSFET's," vol. 130, No. 5, pp. 1139–1144.

Takashi Ito, Takao Nozaki, and Hajime Ishikawa, "Direct Thermal Nitridation of Silicon Dioxide Films in Anhydrous Ammonia Gas," J. Electrochem. Soc., vol. 127, No. 9, pp. 2053–2057.

Tetsuya Taguwa, Koji Urabe, Makoto Sekine, Yoshiaki Yamada and Takamaro Kikkawa, "Low Contact Resistance Metallization for Gigabit Scale DRAM's Using Fully–Dry Cleaning by $Ar/H_2$ ECR Plasma," IEEE Transactions on Electron Devices, vol. 44, No. 4, Apr. 1997, pp. 588–593.

Yasushi Sawada, Hiroshi Tamaru, Masuhiro Kogoma, Motoaki Kawase, and Kenji Hashimoto, "The Reduction of Copper Oxide Thin Films With Hydrogen Plasma Generated By An Atmospheric–Pressure Glow Discharge," J. Phys. D: Appl. Phys. 29 (1996), pp. 2539–2544.

Kazuo Kanehiro, et al. "Cleaning of copper or copper alloy for dry coating"; Chemical Abstracts, vol. 107, No. 26, p. 283; Dec. 28, 1987.

Research Disclosure XP000099373, "Low Temperature Process for Surface Cleaning", No. 309, p. 82, Jan. 1, 1990.

S. Hymes, et al. "Surface Cleaning of Copper by Thermal and Plasma Treatment in Reducing and Inert Ambients", 1 Vac. Sci. Technol. vol. 16, No. 3 May/Jun. 1998; pp. 1107–1109.

Richard Swope, Woo Sik Yoo, Julian Hsieh, Shari Shuchmann, Ferenc Nagy, Harald te Nijenhuis, and David Mordo, "Improvement of Adhesion Properties of Fluorinated Silica Glass Films by Nitrous Oxide Plasma Treatment," J. Electrochem. Soc., vol. 144, No. 7, Jul. 1997, pp. 2559–2564.

S. Takeishi, H. Kudah, R. Shinohara, A. Tsukune, Y. Satoh, H. Miyazawa, H. Harada, and M. Yamada, "Stabilizing Dielectric Constants of Fluorine–Doped $SiO_2$ Films by $N_2O$–Plasma Annealing," J. Electrochem. Soc., vol. 143, No. 1, Jan. 1996, pp. 381–384.

K. Mikagi, H. Ishikawa, T. Usami, M. Suzuki, K. Inoue, N. Oda, S. Chikaki, I. Sakai and T. Kikkawa, "Barrier Metal Free Copper Damascene Interconnection Technology Using Atmospheric Copper Reflow and Nitrogen Doping in SiOF Film," ©1996 IEEE, IEVM 96, 365–368, pp. 14.5.1–14.5.4.

Ogawa et al., "Novel ARC Optimization Methodology for KrF Excimer Laser Lithography at Low K1 Factor", *Proceedings of the SPIE. Optical/Laser Microlithography V*, vol. 1674, 1992, pp. 362–375.

Dijkstra et al., "Optimization of Anti–Reflection Layers for Deep UV Lithography", *Proceedings of SPIE Optical/Laser Microlithography, Bellingham, SPIE*, vol. 1927, pp. 275–286.

U.S. patent application Ser. No. 09/082,746, Cohen et al., filed May 21, 1998.

U.S. patent application Ser. No. 09/092,811, Yang et al., filed Jun. 5, 1998.

U.S. patent application Ser. No. 09/193,920, Rathi et al., filed Nov. 17, 1998.

U.S. patent application Ser. No. 09/525,556, Festa et al., filed Mar. 15, 2000.

U.S. patent application Ser. No. 09/219,945, Bencher et al., filed Dec. 23, 1998.

U.S. patent application Ser. No. 09/165,248, Rathi et al., filed Oct. 1, 1998.

U.S. patent application Ser. No. 09/270,039, Huang, filed Mar. 16, 1999.

Australian Patent Office Search Report Apr. 10,m 2002.

* cited by examiner

METHOD AND APPARATUS FOR TREATING LOW K DIELECTRIC LAYERS TO REDUCE DIFFUSION

CROSS-REFERENCE TO RELATED APPLICATIONS

This application claims priority to U.S. provisional patent application serial number 60/218,407, filed Jul. 14, 2000, which is herein incorporated by reference. This application is related to co-pending U.S. patent application Ser. No. 09/336,525 (AMAT/3577.X1), filed on Jun. 18, 1999, co-pending U.S. patent application Ser. No. 09/657,392 (AMAT/4479), filed on Sep. 8, 2000, and co-pending U.S. patent application Ser. No. 09/627,667 (AMAT/4683) filed on Jul. 28, 2000.

BACKGROUND OF THE INVENTION

1. Field of the Invention

The present invention generally relates to the fabrication of integrated circuits on substrates and to a method for reducing oxygen diffusion into dielectric layers.

2. Background of the Related Art

Consistent and fairly predictable improvement in integrated circuit design and fabrication has been observed in the last decade. One key to successful improvements is the multilevel interconnect technology that provides the conductive paths in an integrated circuit (IC) device. The shrinking dimensions of conductive or semi-conductive substrate features such as horizontal lines and vertical contacts, vias, or interconnects, in very large scale integration (VLSI) and ultra large scale integration (ULSI) technology, has increased the importance of improving the current density of semi-conductor devices.

In order to further improve the current density of semiconductor devices on integrated circuits, it has become necessary to use conductive materials having low resistivity and low dielectric constant (low k) materials (defined herein as having dielectric constants, k, less than about 3.0 for dielectric layers and less than about 5.5 for etch stops and barrier layers) as insulating layers to reduce the capacitive coupling between adjacent interconnects. Current dielectric material have relatively capacitive coupling between interconnects, which may lead to cross talk and/or resistance-capacitance (RC) delay, i.e., the time required to dissipate stored energy, that degrades the overall performance of semi-conductor devices.

However, typical low k dielectric materials are generally porous and require a barrier layer to prevent interlayer diffusion of materials into the low k dielectric materials. Conventional barrier layer materials typically have dielectric constants that are greater than 7.0, such as silicon nitride. When the conventional barrier layer materials are used in conjunction with low k dielectric materials, the resulting insulator stack typically minimizes the improved dielectric constant of the low k material effect and often produces a stack having a dielectric constant that is not much below 6.0.

One additional difficulty in using traditional low k dielectric materials as insulating layers is the increase in the use of copper in integrated circuits. Copper (Cu) is becoming an interconnect material of choice because of copper's low resistivity (1.7 $\mu\Omega$-cm) and high current carrying capacity. However, copper diffuses more readily into surrounding materials and can alter the electronic device characteristics of the adjacent layers and, for example, form a conductive path across the dielectric layers, thereby reducing the reliability of the overall circuit and may even result in device failure. This diffusion characteristic of copper, especially with regard to the new low k films which tend to be porous and susceptible to diffusion, increases the need for diffusion resistant barrier layers with low k characteristics.

Silicon carbide (SiC) layers have been recognized as potential candidates for use as low k barrier materials. In particular, as disclosed in U.S. patent application Ser. No. 09/165,248, entitled "A Silicon Carbide Deposition For Use As A Barrier Layer And An Etch Stop", filed Oct. 1, 1998, commonly owned by the assignee of the present application and incorporated by reference herein to the extent not inconsistent with the invention, silicon carbide layers are recognized as low k barrier layers.

However, low k silicon carbide layers are porous and susceptible to oxygen diffusion into the layer, particularly the surface of the layer. Oxygen may react with the silicon material in the silicon carbide layer to form oxides, which is believed to increases the diffusion of conducting materials, such as copper, into silicon carbide and reduce the overall effectiveness of the barrier layer. Oxygen diffusion into silicon carbide layers can occur by exposure to oxygen during deposition of the silicon carbide layer or during transport between processing chambers and cluster tools when the layers may be exposed to an oxidizing environment.

Additionally, oxygen incorporation in silicon carbide layers detrimentally affects bonding, or adhesion, of the layer to adjacent materials, especially to conducting metals such as copper, and may result in layer delamination of materials. Additionally, oxides formed in the silicon carbide layers typically have a lower density than the adjacent silicon-carbide material. The low density oxide formation in the surface and upper portions of a layer can result in the deformation of layers as bulges or "humps", which are particularly undesirable for conformally filling high aspect ratio features and may form voids and other deposition defects in subsequently deposited materials.

Therefore, there is a need for a process for reducing oxygen diffusion in low k layers. Ideally, the process would reduce oxygen content in barrier layers, such as silicon carbide layers used in copper metallization.

SUMMARY OF THE INVENTION

Aspects of the invention generally relate to a method for producing low dielectric constant layers, such as silicon carbide, that are resistant to oxygen diffusion and have low oxygen content, which may be useful as passivating and/or barrier layers in copper metallization. In one aspect of the invention, a method is provided for processing a substrate comprising depositing a low dielectric constant layer on a substrate in a processing chamber, introducing a processing gas into the chamber, generating a plasma of the processing gas, and exposing the low dielectric constant layer to the plasma of the processing gas.

In another aspect of the invention, a method is provided for processing a substrate, comprising depositing a silicon carbide layer on the substrate in a processing chamber, introducing a processing gas selected from the group of an inert gas, a nitrating gas, and combinations thereof, into the processing chamber, generating a plasma of the processing gas, and modifying a surface of the silicon carbide layer by exposing the silicon carbide layer to the plasma of the processing gas to form a passivating surface on the silicon carbide layer. The inert gas may comprise helium, argon, and combinations thereof, and the nitrating gas may comprise ammonia, nitrogen, a nitrogen and hydrogen mixture, nitrous oxide, and combinations thereof.

In another aspect, the invention provides a method for forming a low dielectric constant barrier layer on a substrate comprising depositing a low dielectric constant layer on the substrate, and then depositing a thin passivating layer on the low dielectric constant layer. The passivating layer comprises a silicon and nitrogen containing material such as silicon nitride or silicon oxynitride.

BRIEF DESCRIPTION OF THE DRAWINGS

So that the manner in which the above recited aspects of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

The invention will now be described in reference to a plasma process and to a chemical vapor deposition process that can be carried out using processing equipment, such as a Centura® platform, available from Applied Materials, Inc., located in Santa Clara, Calif. The equipment preferably includes an integrated platform having a CVD chamber, such as a DxZ™ CVD chamber or a Producer™ CVD Chamber, both of which are available from Applied Materials, Inc. of Santa Clara, Calif. The following chamber description is illustrative and should not be construed or interpreted as limiting the scope of the invention.

Figure 1:
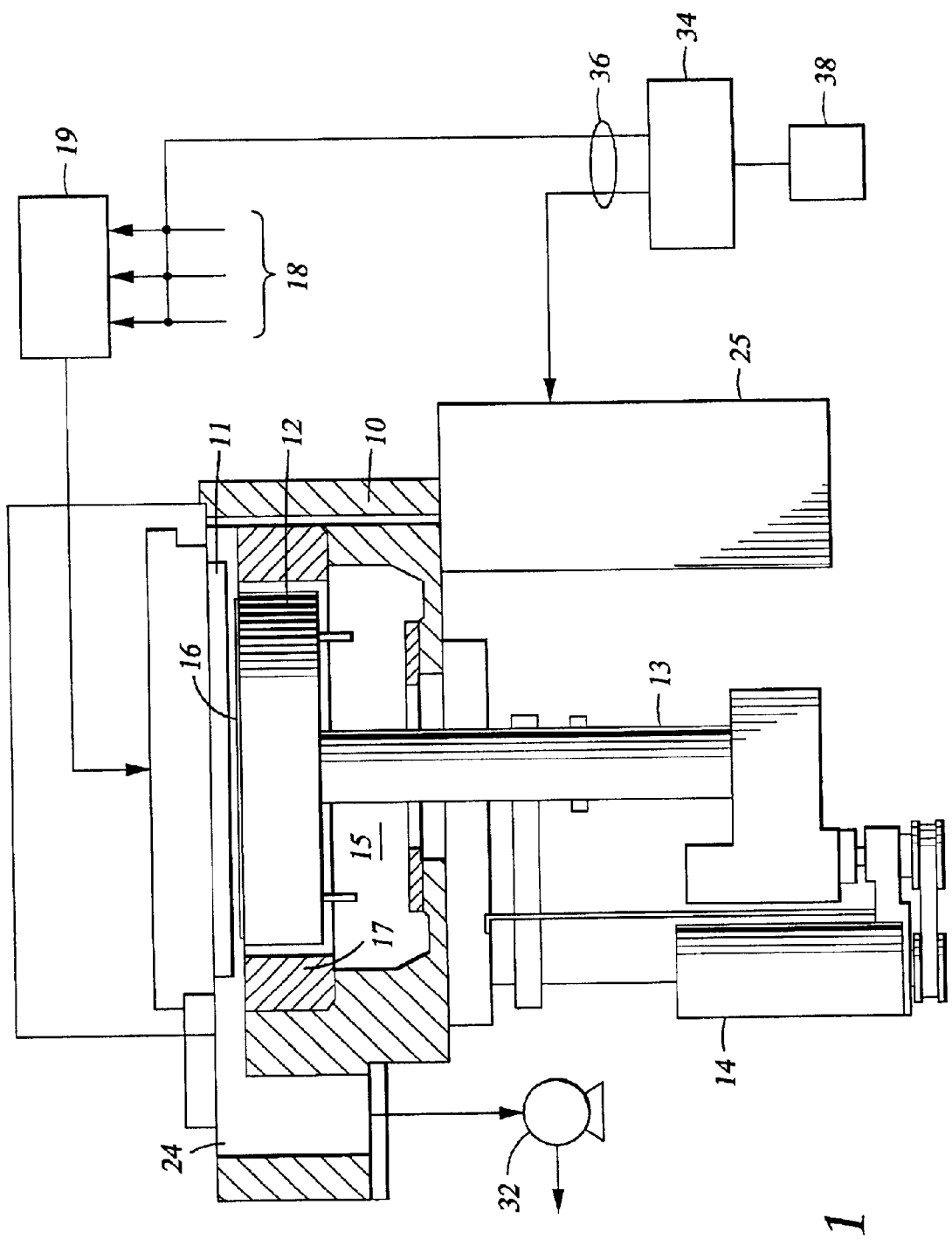
FIG. 1 shows a cross-sectional view of one commercially available CVD plasma processing chamber in which the process of the invention may be performed.

FIG. 1 is a cross-sectional view of a CVD chamber capable of generating and maintaining a plasma in which the above described processes may be performed. Chamber 10 contains a gas distribution plate 11 disposed above substrate support plate or susceptor 12 and defines a processing region therebetween for processing a substrate 16. Susceptor 12 can be resistively heated and is mounted on a support stem 13 so that susceptor 12 can be controllably moved by a lift motor 14 between a lower loading/off-loading position and an upper, or processing, position. When the susceptor 12 is in the processing position, an insulator ring 17 is disposed circumferentially around the susceptor 12 and any substrate 16 disposed thereon. Processing gases introduced into the chamber 10 via inlets (not shown) of the gas distribution plate 11 and are uniformly distributed radially across the processing region and substrate surface. The processing gases are exhausted through a port 24 by a vacuum pump system 32.

A thermal or plasma enhanced process may be performed in chamber 10, and preferably the plasma enhanced process is used for the post deposition layer treatments of the invention. In a plasma process, a controlled plasma can be formed adjacent to the substrate by applying RF energy to the gas distribution plate 11 from RF power supply 25 with susceptor 12 grounded. A RF power supply 25 can supply either single or mixed frequency RF power to the gas distribution plate 11 to enhance the decomposition of any reactive species introduced into chamber 15. A mixed frequency RF power supply typically supplies power at a high RF frequency (RF1) of about 13.56 MHz and at a low RF frequency (RF2) of about 350 kHz.

Typically, the chamber lining, the gas distribution plate 11, the susceptor 12, and various other processing chamber hardware are made out of aluminum or anodized aluminum. An example of a CVD processing chamber is described in U.S. Pat. No. 5,000,113, entitled "A Thermal CVD/PECVD Processing chamber and Use for Thermal Chemical Vapor Deposition of Silicon Dioxide and In-situ Multi-step Planarized Process", issued to Wang et al., and assigned to Applied Materials, Inc., the assignee of the invention, and is incorporated by reference herein to the extent not inconsistent with the invention.

The lift motor 14 raises and lowers susceptor 12 between a processing position and a lower, substrate-loading position. A system controller 34 controls the motor, the gas mixing system 19, and the RF power supply 25 over control lines 36. The processing chamber includes analog assemblies, such as mass flow controllers (MFCs) and standard or pulsed RF generators, that are controlled by the system controller 34 which executes system control software stored in a memory 38, which in the preferred embodiment is a hard disk drive. Motors and optical sensors can be used to move and determine the position of movable mechanical assemblies such as the throttle valve of the vacuum pump 32 and motor for positioning the susceptor 12.

The system controller 34 controls the activities of the CVD processing chamber and may include a hard disk drive, a floppy disk drive, and a card rack. The card rack contains a single board computer (SBC), analog and digital input/output boards, interface boards and stepper motor controller boards. The system controller conforms to the Versa Modular Europeans (VME) standard which defines board, card cage, and connector dimensions and types. The VME standard also defines the bus structure having a 16-bit data bus and 24-bit address bus. The system controller 34 operates under the control of a computer program stored on the hard disk drive 38. The computer program dictates the timing, mixture of gases, RF power levels, susceptor position, and other parameters of a particular process.

The particular embodiment of the apparatus 10 shown herein is provided to illustrate the invention, and should not be construed or interpreted as limiting the scope of the invention.

Exemplary Processes

Aspects of the invention will now be described with reference to preferred processes practiced using the above described processing system. Aspects of the invention generally relate to methods for producing low dielectric constant layers, such as silicon carbide, that are resistant to oxygen diffusion and have low oxygen content, which may be useful as passivating and/or barrier layers in copper metallization. The layers may be formed in situ or ex situ with reduced oxygen contents by exposing the low dielectric constant layer to a plasma of an inert gas to densify the layer and form a passivating surface, by exposing the low dielectric constant layer to a nitrating plasma to form a passivating nitride surface on the layer, or by depositing a thin passivating layer on the low dielectric constant layer to reduce oxygen diffusion into the layer.

A passivating surface is broadly defined herein as material or a layer of material which reduces diffusion of moisture, oxygen, and other adverse conditions which the surface or layer may be exposed to under ambient conditions or by process contamination. The passivating surface may also reduce diffusion of conductive metals such as copper. In situ is broadly defined herein as performing two or more processes in the same chamber or in the same processing system without breaking vacuum or without exposing the material to intermediate contamination environments.

In one embodiment, a low k dielectric layer is deposited and then treated by a plasma process according to the invention described herein to form a passivating surface on the low k dielectric layer. The plasma process may be used to treat a low k dielectric layer, such as silicon carbide, for use as a low k dielectric passivating and/or barrier layer.

A low k dielectric layer comprising silicon carbide can be deposited from a carbon containing silicon source material supplied to a plasma processing chamber at a flow rate between about 10 and about 1000 standard cubic centimeters (sccm). The carbon containing silicon source material comprises one or more organosilane precursor, such as trimethylsilane, dimethylsilane, methylsilane, and combinations thereof. Alternatively, separate silicon containing and carbon containing process gases, such as silane and methane respectively can be introduced into the processing chamber for deposition of silicon carbide.

An inert gas, such as helium, argon, and combinations thereof is also supplied to the chamber at a flow rate between about 50 sccm and about 5000 sccm. The chamber pressure is maintained between about 100 milliTorr and about 15 Torr. The substrate surface temperature is maintained between about 100° C. and about 450° C. during the deposition process. The gas distribution plate 11 is spaced between about 200 mils and about 600 mils (thousandths of an inch) from the substrate.

Power from a single 13.56 MHz RF power source is supplied to the chamber 10 to form the plasma at a power density between about 0.3 watts/cm$^2$ and about 3.2 watts/cm$^2$, or a power level between about 100 watts and about 1000 watts for a 200 mm substrate. A power density between about 0.9 watts/cm$^2$ and about 2.3 watts/cm$^2$, or a power level between about 300 watts and about 700 watts for a 200 mm substrate, is preferably supplied to the processing chamber to generate the plasma.

One exemplary processing regime for depositing a silicon carbide material comprises introducing a processing gas including trimethylsilane to a processing chamber at a flow rate between about 30 sccm and 500 sccm, and introducing an inert gas of argon into the processing chamber at a rate between about 100 sccm and about 2000 sccm, maintaining a chamber pressure between about 3 Torr and about 10 Torr, maintaining a substrate surface temperature between about 200° C. and about 400° C., and supplying between about 300 watts and 700 watts to the chamber to generate the plasma of the processing gas. The gas distribution plate 11 is spaced between about 300 mils and about 600 mils from the substrate.

The low k silicon carbide layers deposited by the processes described above are hydrogenated silicon carbide layers having dielectric constants of about 5.5 or less for use as barrier layers. Additionally, the low k silicon carbide layers deposited from the process regimes described above have been observed to have a layer composition of about a 1:1 molar ratio of silicon and carbon with hydrogen comprising between about 30% and about 45% of the layer by atomic concentration. The low k silicon carbide layers may be used as passivating layers, barrier layers, etch stops, and anti-reflective coatings in forming semi-conductor devices.

Processes for depositing silicon carbide layers with low dielectric constants are more fully described in co-pending U.S. patent application Ser. No. 09/165,248, filed Oct. 1, 1998, in co-pending U.S. patent application Ser. No. 09/219, 945, filed Dec. 23, 1998, and in co-pending U.S. patent application Ser. No. 09/270,039, filed Mar. 16, 1999, which descriptions are incorporated by reference herein to the extent not inconsistent with the invention. The embodiments described herein for depositing silicon carbide layers are provided to illustrate the invention, the particular embodiment shown should not be used to limit the scope of the invention. The invention also contemplates other processes and materials used to deposit silicon carbide layers.

The Inert Gas Plasma Process

In one embodiment of the invention, the above deposited low k silicon carbide layer is exposed to a plasma of an inert gas to densify the layer surface to form a passivating surface and to reduce oxygen diffusion into the layer. A substrate is positioned in a processing chamber and an inert gas selected from the group of helium, argon, and combinations thereof is introduced into the chamber at a flow rate between about 200 sccm and about 2000 sccm. A chamber pressure between about 1 Torr and about 12 Torr is achieved and maintained during the plasma treatment process. The substrate is maintained at a temperature of about 100° C. and about 450° C. The substrate temperature is preferably maintained at about 350° C. during the plasma treating process.

A plasma of the inert gas is generated by supplying a RF power density between about 0.08 watts/cm$^2$ and about 6.4 watts/cm$^2$, or a RF power level between about 25 and about 2000 Watts for a 200 mm substrate, to the processing chamber. A RF power density between about 0.3 watts/cm$^2$ and about 3.2 watts/cm$^2$, or a RF power level between about 100 and about 1000 Watts for a 200 mm substrate, is preferably supplied to generate a plasma. The plasma treatment is performed for between about 30 and about 120 seconds. The plasma to treat the deposited layer may be performed in situ with the deposition of the low k silicon carbide layer.

One treatment process for the deposited silicon carbide layer is performed by introducing helium into the chamber containing a 200 mm substrate at a flow rate of about 400 sccm. A chamber pressure of about 8 Torr and a substrate temperature of about 350° C. is achieved and maintained during the treatment process. A plasma is generated by supplying a RF power density between about 1.2 watts/cm$^2$ and about 1.6 watts/cm$^2$, or a RF power between about 400 watts and 500 watts, to the processing chamber for about 50 seconds to treat the silicon carbide layer.

An example of a preferred treatment process for the deposited silicon carbide layer is performed by introducing helium into the chamber containing a 200 mm substrate at a flow rate of about 1300 sccm, maintaining a chamber pressure of about 8.7 Torr, maintaining a substrate temperature of about 350° C., applying about 250 watts to the processing chamber to generate a plasma, and maintaining the plasma for about 50 seconds.

The plasma treatment may be performed in situ within the silicon carbide deposition chamber or a different processing chamber within the same integrated system, i.e., without breaking vacuum between processes. It has been observed that the inert gas plasma treatment described herein produces a silicon carbide layer having an oxygen content of less than about 6% atomic concentration.

Figure 2:
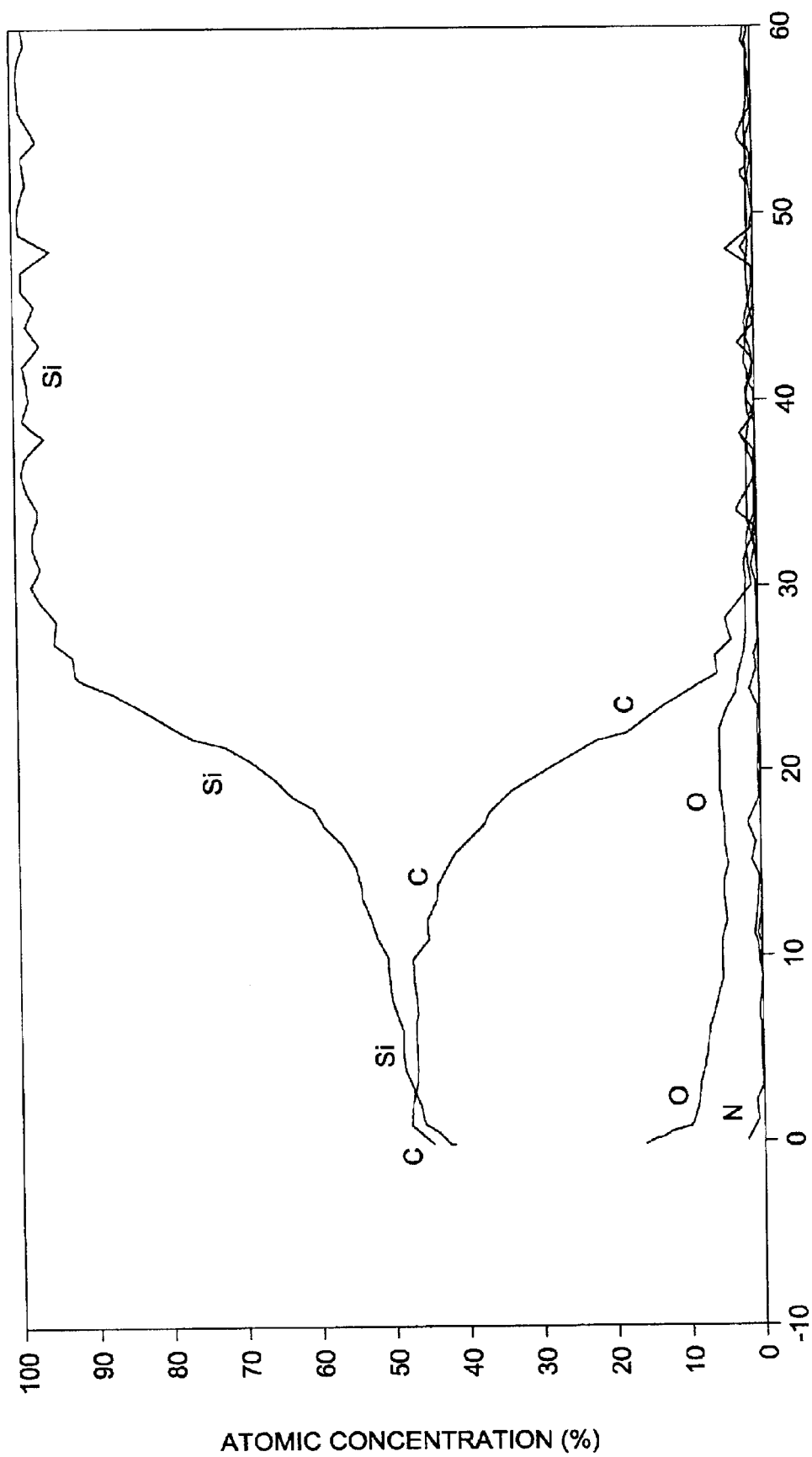
FIG. 2 shows a X-ray Photoelectron Spectroscopy (XPS) plot of atomic concentration of a silicon carbide layer treated by an inert gas plasma.

FIG. 2 shows a X-ray Photoelectron Spectropy (XPS) plot of atomic concentration (atomic %) in relation to the sputtering time (min) of a 500 Å thick silicon carbide layer treated according to the inert gas plasma process described herein. The plot describes the atomic concentration of the elements of the layer, except hydrogen, in relation to the depth of the layer. The XPS data is collected after each one minute sputtering of the layer, which removes material at a rate of about 20 Å and about 25 Å per minute. The x-axis of FIG. 2, the sputtering time, is an indication of the concentration of the elements at various depths of the layer. The y-axis of FIG. 2 indicates the concentration of the elements, where carbon is referenced by C, silicon is referenced by Si, oxygen is referenced by O, and nitrogen is referenced by N, in the layer according to the time of the sputtering procedure.

It was observed that the average oxygen concentration of the layer is demonstrated to be between about 4% and about 6% following the inert gas plasma treatment, which is less than the expected 10% to 15% oxygen concentration known to occur in untreated silicon carbide layers.

It is believed that the plasma species formed in the inert gas densify the surface of the layer by removing material such as carbon and hydrogen from the film, removing pores formed in the material, and removing or reducing voids and other such layering defects formed therein. A comparison of the density of the surface of the silicon carbide material (approximately 90 Å to 100 Å) compared to the underlying bulk silicon carbide material (approximately 390 Å to 420 Å) indicated a surface density of about 1.45 g/cm$^3$ to about 1.59 g/cm$^3$ versus a bulk density of about 2.08 g/cm$^3$ and about 2.14 g/cm$^3$.

It is further believed that densifying the surface provides a passivating surface resistant to oxygen diffusion into the layer, which produces a layer having an enhanced resistance to diffusion of oxygen and oxidation of the layer material as well as improved adhesion to adjacent layers in comparison to untreated silicon carbide layer. It is also believed, the denser surface is more resistant to diffusion of other materials, such as copper, used in semi-conductor manufacturing.

The Nitrating Gas Plasma Process

In another embodiment of the invention, a low k silicon carbide layer is exposed to a plasma of a nitrating gas to form a nitrogen rich surface on the silicon carbide layer. The nitrogen rich surface of the silicon carbide layer may include silicon nitride, silicon carbon nitride, silicon oxynitride, or silicon carbon oxynitride, and is referred to herein as a nitrided surface. The nitrating gas is selected from the group of ammonia, nitrogen, nitrous oxide, and combinations thereof. Ammonia is generally used for forming the nitrided surface due to ammonia's ease of disassociation at high processing temperatures, i.e., greater than 250° C. and ammonia's ease of disassociation in the presence of a plasma.

The nitrided surface described herein may be formed on a silicon carbide layer by the following process. A substrate is positioned in a processing chamber and a nitrating gas is introduced into the processing chamber at a flow rate between about 100 and about 3000 sccm. The processing chamber is maintained at a pressure between about 100 milliTorr and about 25 Torr. The pressure of the chamber is preferably maintained between about 1 Torr and about 12 Torr, with a pressure between about 5 and about 10 Torr being most preferred. The substrate is maintained at a temperature between about 100° C. and about 500° C. during the plasma treatment.

A plasma is generated by supplying a power density between about 0.08 watts/cm$^2$ and about 6.4 watts/cm$^2$, or a RF power level between about 25 and about 2000 Watts for a 200 mm substrate, to the processing chamber. A RF power density between about 0.3 watts/cm$^2$ and about 3.2 watts/cm$^2$, or a RF power level between about 100 and about 1000 Watts for a 200 mm substrate, is preferably supplied to generate a plasma. The layer is exposed to the nitrating plasma for between about 10 seconds and about 120 seconds to produce a nitrate surface between about 50 Å (Angstroms) and about 400 Å thick. The plasma treatment may be performed in situ within the same chamber as the silicon carbide deposition or in a different chamber within the same integrated system.

One exemplary nitrating plasma treatment for the deposited low k dieletric layer comprises providing ammonia at a flow rate between about 200 sccm and about 600 sccm to a process chamber containing a 200 mm substrate having a silicon carbide layer formed thereon, maintaining a chamber pressure between about 8 Torr and about 9 Torr, maintaining the substrate at a temperature between about 300° C. and about 400° C. during the nitrating step, supplying a RF power density between about 1.2 watts/cm$^2$ and about 1.6 watts/cm$^2$, or a RF power between about 400 Watts and about 500 Watts to the processing chamber to generate a plasma, and maintaining the plasma between about 5 and about 60 seconds to modify the surface of the silicon carbide layer to produce a nitrate surface. The plasma may be generated in one or more treatment cycles. Alternatively, the silicon carbide layer is exposed to the plasma process for between about 20 and about 60 seconds.

The nitrating gas may further comprise an inert gas, such as argon and helium, to help treat the surface of the layer, as well as to assist in stabilizing the gas flow and the plasma reaction. Inert gases that can be used in conjunction with the nitrating process are introduced into the processing chamber at a flow rate of less than about 2000 sccm. The nitrating gas may also comprise a reactive gas, such as hydrogen, which can assist in removing contaminants in the layer during the nitrating process.

The plasma treatment may be performed in situ within the silicon carbide deposition chamber or a different processing chamber within the same integrated system, i.e., without breaking vacuum between processes. It has been observed that the nitrating gas plasma treatment described herein produces a silicon carbide layer having an oxygen content of less than about 6% atomic concentration.

Figure 3:
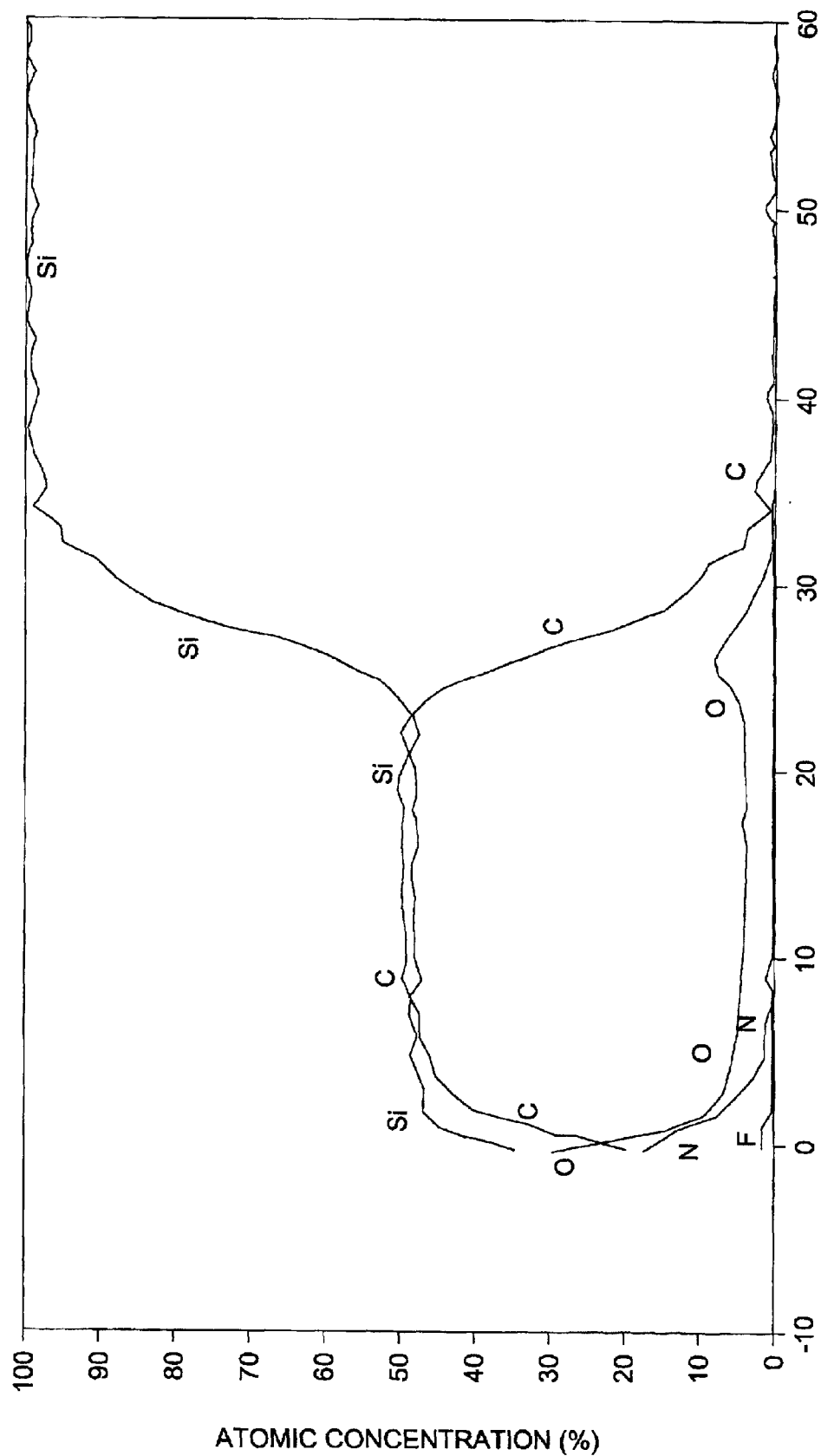
FIG. 3 shows a XPS plot of atomic concentration of a silicon carbide layer treated by an nitrating gas plasma.

FIG. 3 shows a X-ray Photoelectron Spectropy (XPS) plot of atomic concentration (atomic %) in relation to the sputtering time (min) of a 500 Å thick silicon carbide layer deposited as described herein on a silicon substrate. The silicon carbide layer was treated using ammonia with a flow rate of about 400 sccm, maintaining a chamber pressure of about 8 Torr, generating a plasma by supplying a RF power of about 350 watts for a 200 mm substrate, and maintaining the substrate temperature at about 350° C. The y-axis of FIG. 3 indicates an average oxygen concentration in the layer of about 4% atomic concentration which is lower than the expected 10% to 15% oxygen concentration observed in untreated silicon carbide layers.

While a nitrogen plasma is used in one embodiment of a plasma treatment method for forming a nitrided surface on the silicon carbide layer, the nitrating gas may be provided over the layer and a different reaction, such as a thermal reaction, may facilitate the nitrating reaction between the layer and the nitrating gas.

In this alternative embodiment of the invention, the deposited low k silicon carbide layer may be exposed to the nitrating gas during a thermally enhanced process to devolve oxygen from the layer and form a nitrided surface on the layer. A thermal process includes introducing the nitrating gas into the processing chamber at a flow rate between about 100 and about 3000 sccm, maintaining the chamber pressure between about 5 Torr and about 25 Torr, and maintaining the substrate at a temperature between about 350° C. and about 500° C. during the treatment process. Alternatively, the chamber pressure can be maintained at between about 8 Torr and about 10 Torr during the annealing process. The substrate is preferably maintained at a temperature of about 450° C. during the annealing process.

The nitrided surface is believed to form a thin passivating nitride surface of silicon nitride, silicon carbon nitride, silicon oxynitride, or silicon carbon oxynitride on the silicon carbide layer as nitrogen is incorporated into the layer. The nitrided surface is more resistant to oxygen diffusion into the silicon carbide layer than untreated silicon carbide layers. It is also believed that the passivating nitrided surface will not noticeably increase the dielectric constant of the silicon carbide layer. It is further believed that nitrating the layer surface will produce atomic bonding of nitrogen to the amorphous silicon carbide layer, thereby enhancing interfacial bonding and adhesion while reducing interlayer defects with adjacent layers. Further, it has been observed that the nitrided surface has a greater resistance to diffusion of other materials, such as water and copper, than layers containing silicon oxides, thereby enhancing the barrier properties of a silicon carbide layers in copper metallization processes.

Figure 4:
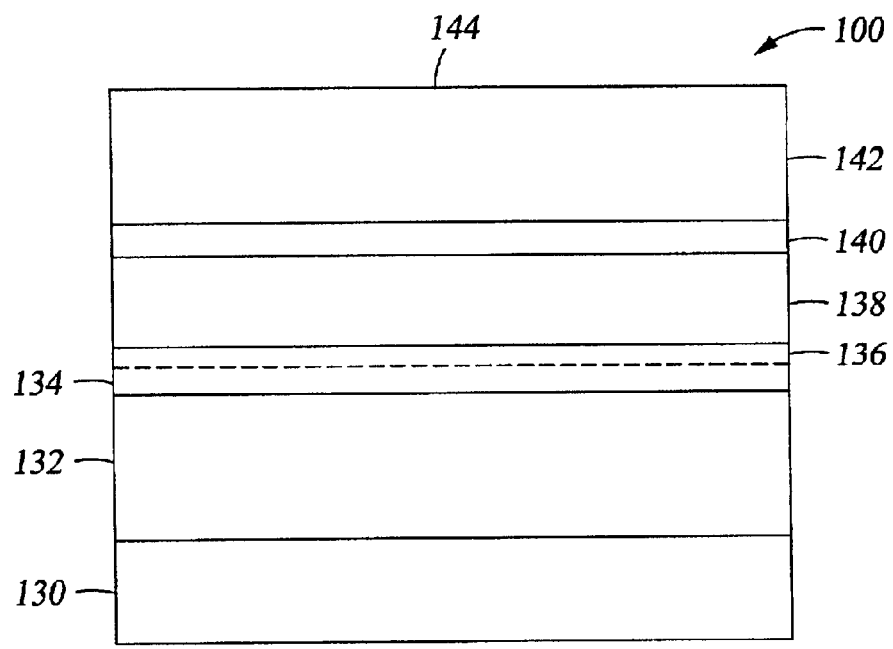
FIG. 4 shows a cross-sectional view of a substrate having a plasma treated silicon carbide layer formed thereon.

FIG. 4 illustrates use of a low k silicon carbide layer as a barrier layer in a copper metallization stack 100 formed by treating the silicon carbide layer with either an inert gas or nitrating plasma of the invention. The barrier layer 134 was created using the low k silicon carbide deposition process regime described above. The metallization stack 100 is formed by first depositing an oxide layer 132 about 5000 Å thick on a silicon substrate 130. A first low k silicon carbide barrier layer 134 was then deposited on the oxide layer 132 to a thickness of about 800 Å. Next, the first low k silicon carbide barrier layer 134 is plasma treated by either an inert gas or by an nitrating gas process described herein to provide a diffusion resistant surface 136. Next, a copper layer 138 about 5000 Å thick is deposited on the diffusion resistant surface 136 of the first low k silicon carbide barrier layer 134. A second low k silicon carbide barrier layer 140 is deposited on the copper layer 138 to a thickness of about 800 Å, and an oxide layer 142 about 1000 Å thick is deposited on the second low k silicon carbide barrier layer 140. Alternatively, a metal nitride barrier layer, such as titanium nitride (TiN) or tantalum nitride (TaN), may also be deposited prior to the copper layer to further limit interlayer diffusion into the silicon carbide layer 134 by the copper layer 138. The above metallization stack 100 is provided for illustrative purposes and should not be construed or interpreted as limiting the scope of the invention. For example, the silicon carbide layer 140 may perform as an etch stop or as an anti-reflective coating for forming features in a dual damascene fabrication.

The Silicon Nitride Passivating Layer

In another embodiment, capping the silicon carbide layer with a thin passivating layer comprising silicon and nitrogen may reduce oxygen diffusion into a low k silicon carbide layer. The passivating layer may comprise silicon nitride, silicon carbon nitride, silicon oxynitride, or silicon carbon oxynitride.

A passivating layer is deposited on a silicon carbide layer by introducing a silicon containing gas at a flow rate between about 50 sccm and about 1000 sccm and a nitrogen containing gas at a flow rate at between about 50 sccm and about 2000 sccm into the process chamber. The silicon containing gas is selected from the group of silane, methylsilane, trimethylsilane, substituted derivatives thereof, and combinations thereof. The nitrogen containing gas is selected from the group of ammonia, nitrogen, nitrous oxide, and combinations thereof. The nitrating gas may contain oxygen, such as in nitrous oxide, to deposit a silicon oxynitride passivating layer.

The substrate is maintained at a temperature between about 100° C. and about 550° C. The chamber pressure is maintained at between about 1 Torr and about 25 Torr. The chamber pressure is preferably maintained between about 4 Torr and 5 Torr during the deposition process. A RF power density between about 0.3 watts/cm$^2$ and about 3.2 watts/cm$^2$, or a RF power level between about 100 Watts and about 1000 Watts for a 200 mm substrate, is preferably supplied to the processing chamber to generate a plasma of the processing gases.

The silicon nitride layer may be deposited to a thickness between about 25 Å and about 500 Å. The passivating layer is preferably deposited to a thickness between about 50 Å and about 200 Å. It is contemplated that layer may be deposited to any thickness dependent upon the processing application using a silicon carbide layer and passivating layer.

The passivating layer may be deposited on the silicon carbide layer in situ within the same processing chamber or in a different chamber within the same integrated system, i.e., without breaking vacuum between processes. The passivating layer is preferably deposited in situ following deposition of the low k silicon carbide layer to prevent exposure of the silicon carbide layer to the atmosphere where contamination and oxidation may occur. The silicon nitride and silicon oxynitride layers have a carbon content of less than about 5% atomic concentration. While the silicon nitride and silicon oxynitride are illustrated as being deposited by the method described above, other methods and materials capable of depositing passivating layers comprising silicon and nitrogen are contemplated by this invention.

Figure 5:
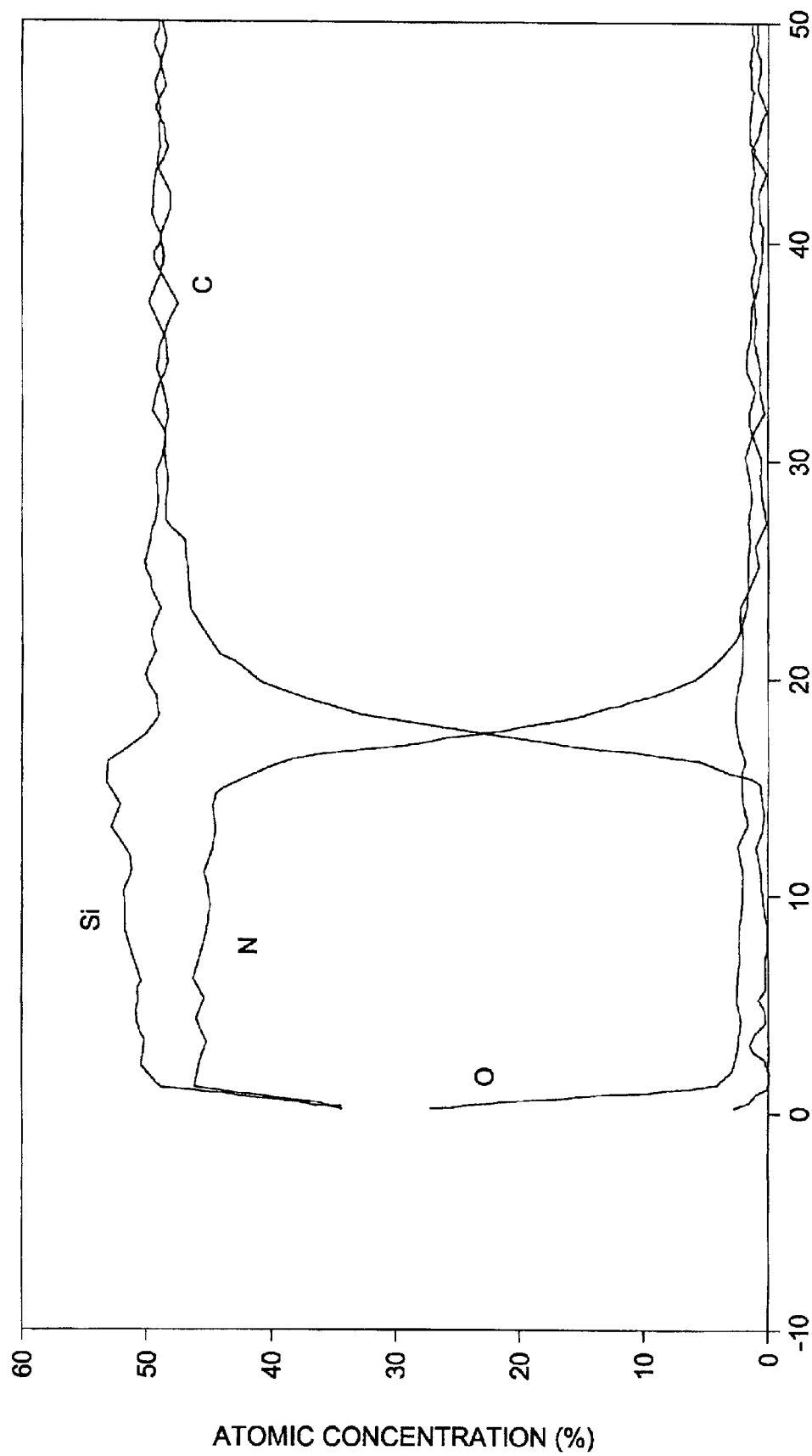
FIG. 5 shows a XPS plot of atomic concentration of another silicon carbide layer with a passivating layer deposited thereon.

FIG. 5 shows a X-ray Photoelectron Spectropy (XPS) plot of atomic concentration (atomic %) in relation to the sputtering time (min) of a 500 Å thick silicon carbide layer deposited as described above on a silicon substrate, and capped by a layer containing silicon and nitrogen as described in the preceding paragraph. The passivating layer was deposited by introducing trimethylsilane into the processing chamber at a rate of about 115 sccm and introducing ammonia into the processing chamber at a rate of about 1500 sccm, maintaining a chamber pressure between about 4 Torr and about 5 Torr, generating a plasma by supplying a RF power of about 350 watts for a 200 mm substrate, maintaining the substrate at a temperature of about 350° C. while reacting trimethylsilane and ammonia.

The passivating layer was deposited to a thickness of approximately 400 Å. The passivating layer may be deposited at a thickness of less than 400 Å to minimize the overall impact of the k value of a SiN/SiC stack. The y-axis of FIG. 5 indicates an average oxygen concentration in the layer of about 2% and about 4% atomic concentration following the deposition of the passivating layer, which is lower than the expected 10 to 15% oxygen concentration observed in untreated silicon carbide layers.

As shown in FIG. 5, at about 20 minutes during the sputtering process, the silicon nitride layer was sputtered through and the silicon nitride layer composition was measured. At this change in layer composition, the oxygen concentration did not vary from the observed average of about 2% to 4% indicating the in situ deposition of the layer reduced oxygen contamination in the silicon carbide layer. It is believed that the plasma enhanced deposition of the thin passivating layer establishes a diffusion resistance layer on the silicon carbide layer to form an integrated barrier layer that has good diffusion resistance to oxygen without adversely affecting the overall dielectric constant of the barrier layer. Further, it is believed that since silicon nitride and silicon oxynitride have greater diffusion resistance to conducting metals, such as copper, that the silicon nitride passivating layer will improve silicon carbide barrier properties.

Figure 6:
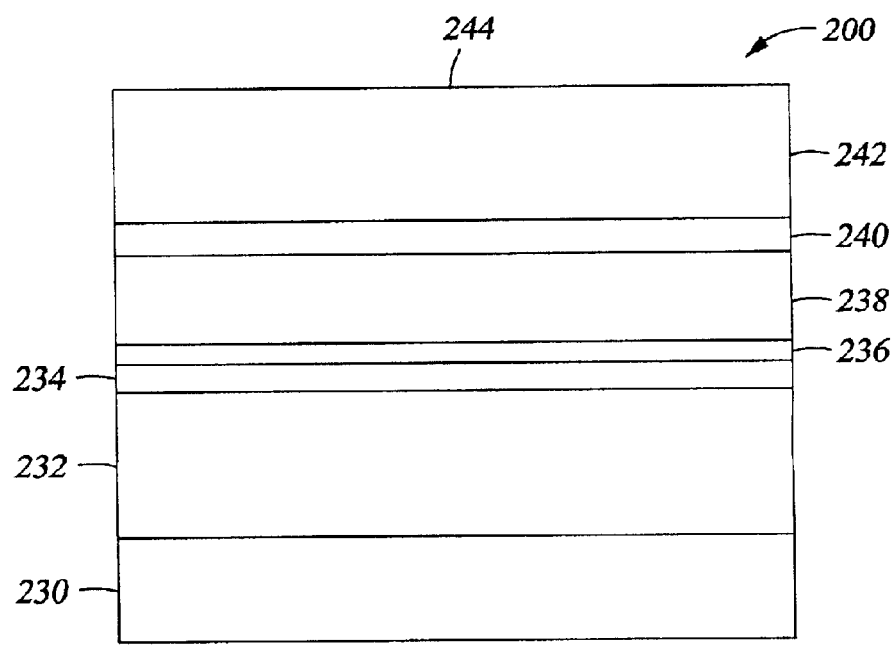
FIG. 6 shows a cross-sectional view of a substrate having a capped silicon carbide layer.

FIG. 6 illustrates the use of the low k silicon carbide barrier layer capped by a silicon nitride passivating layer according to the invention. The metallization stack 200 is formed by first depositing a oxide layer 232 about 5000 Å thick on a silicon substrate 230. A first low k silicon carbide barrier layer 234 is then deposited by the processes described herein on the oxide layer 232 to a thickness of about 800 Å. Next, a silicon nitride passivating layer 236 is deposited the first low k silicon carbide barrier layer from the plasma enhanced deposition of trimethylsilane and ammonia to a thickness of about 400 Å. A copper layer 238 about 5000 Å thick is then deposited on the silicon nitride layer 236 of the silicon carbide barrier layer 234. While not shown, a metal nitride barrier layer, such as titanium nitride (TiN) or tantalum nitride (TaN), may also be deposited prior to the copper layer to limit copper diffusion into the silicon carbide layer 234. Next, a second low k silicon carbide barrier layer 240, formed as described above, is deposited on the copper layer 238 to a thickness of about 800 Å, followed by an about 1000 Å thick oxide layer 242.

It is generally believed that the plasma treatments described herein improve the diffusion resistance, provide improved interlayer bonding and adhesion to adjacent materials of low k layers, such as silicon carbide. It is also believed that and the plasma treatments decrease the resistance or impedance of the combined layers of the metallization as well as reduce contaminants, such as oxygen, from increasing the dielectric constant of the deposited silicon carbide layers. As a passivating and/or barrier layer, the low oxygen content low k materials may reduce the interlayer diffusion of copper and may also minimize the contribution of the passivating and/or barrier layer to the capacitive coupling between interconnect lines. While the following description refers to treating low k silicon carbide layers, the invention also contemplates applying the described processes to other porous layers and other low k layers known in the art and used in semiconductor manufacturing.

While foregoing is directed to the preferred embodiment of the present invention, other and further embodiments of the invention may be devised without departing from the basic scope thereof, and the scope thereof is determined by the claims that follow.

What is claimed is:

1. A method for processing a substrate, comprising:
 depositing a low dielectric constant layer on the substrate in a processing chamber by a plasma enhanced chemical vapor deposition process; and
 treating the low dielectric constant layer with an in situ passivating process comprising:
  introducing a nitrating gas selected from the group consisting of ammonia, nitrogen, nitrous oxide, and combinations thereof, into the processing chamber;
  generating a plasma of the processing gas in the processing chamber; and
  exposing the low dielectric constant layer to the plasma of the processing gas.

2. The method of claim 1, wherein the nitrating gas forms a nitrided surface on the low dielectric constant layer.

3. The method of claim 1, wherein the low dielectric constant layer is exposed to the plasma for between about 10 and about 120 seconds.

4. The method of claim 1, wherein the low dielectric constant layer comprises silicon carbide.

5. The method of claim 1, wherein the low dielectric constant layer has an oxygen content of about 6% or less by atomic concentration.

6. A method for processing a substrate, comprising:
 depositing a silicon carbide layer on the substrate in a processing chamber;
 introducing a processing gas comprising a nitrating gas into the processing chamber;
 generating a plasma of the processing gas in the processing chamber; and
 modifying a surface of the silicon carbide layer by exposing the silicon carbide layer to the plasma of the processing gas to form a passivating surface on the silicon carbide layer.

7. The method of claim 6, wherein the processing gas further comprises an inert gas selected from the group consisting of helium, argon, and combinations thereof.

8. The method of claim 6, wherein the density of the surface of the silicon carbide layer is increased.

9. The method of claim 6, wherein the nitrating gas is selected from the group consisting of ammonia, nitrogen, nitrous oxide, and combinations thereof.

10. The method of claim 6, wherein the processing gas comprises a nitrating gas and a nitrided surface is formed on the low dielectric constant layer.

11. The method of claim 6, wherein exposing the low dielectric constant layer to the plasma comprises supplying a power density between about 0.3 watts/cm$^2$ and about 3.2 watts/cm$^2$ to the processing chamber to generate the plasma.

12. The method of claim 11, wherein the low dielectric constant layer is exposed to the plasma for between about 20 and about 60 seconds.

13. The method of claim 6, wherein the chamber pressure is between about 1 Torr and about 12 Torr.

14. The method of claim 6, wherein processing the substrate comprises introducing a processing gas comprising a nitrating gas into the processing chamber at a flow rate of about 3000 sccm or less, maintaining the processing chamber at a pressure of between about 5 Torr and about 10 Torr, generating the plasma by supplying a power density between about 1.2 watts/cm$^2$ and about 1.6 watts/cm$^2$ to the processing chamber, and maintaining the plasma between about 20 and about 60 seconds.

15. The method of claim 6, wherein the silicon carbide layer is a barrier layer, an etch stop, a passivation layer, or an anti-reflective coating.

16. The method of claim 6, wherein the silicon carbide layer has an oxygen content of about 6% or less by atomic concentration.

17. A method for forming a low dielectric constant barrier layer on a substrate, comprising:

depositing a silicon carbide layer on the substrate; and depositing a passivating layer comprising silicon and nitrogen on the silicon carbide layer by a process comprising:

introducing a silicon containing gas and a nitrogen containing gas into a process chamber containing the substrate;

initiating a plasma in the process chamber; and reacting the silicon containing gas and the nitrogen containing gas in the presence of the plasma to deposit the passivating layer comprising silicon and nitrogen.

18. The method of claim 17, wherein the passivating layer comprises silicon nitride or silicon oxynitride.

19. The method of claim 17, wherein the silicon containing gas is selected from the group of silane, methylsilane, trimethylsilane, substituted derivatives thereof, and combinations thereof.

20. The method of claim 17, wherein the nitrogen containing gas is selected from the group consisting of ammonia, nitrogen, nitrous oxide, and combinations thereof.

21. The method of claim 17, wherein the plasma is generated by supplying a power density between about 0.3 watts/cm$^2$ and about 3.2 watts/cm$^2$ to the chamber.

22. The method of claim 17, wherein the chamber pressure is between about 1 Torr and about 25 Torr.

23. The method of claim 17, wherein the passivating layer comprising silicon and nitrogen is deposited at a thickness between about 25 Å and about 500 Å.

24. The method of claim 1, wherein exposing the low dielectric constant layer to the plasma comprises supplying a power density between about 0.08 watts/cm$^2$ and about 6.4 watts/cm$^2$ to the processing chamber to generate the plasma.

25. The method of claim 24, wherein the low dielectric constant layer is exposed to the plasma for between about 10 and about 120 seconds.

26. The method of claim 1, wherein processing the substrate comprises introducing a processing gas comprising a nitrating gas into the processing chamber at a flow rate of about 3000 sccm or less, maintaining the processing chamber at a pressure of between about 1 Torr and about 12 Torr, generating the plasma by supplying a power density between about 0.3 watts/cm$^2$ and about 3.3 watts/cm$^2$ to the processing chamber, and maintaining the plasma between about 20 and about 60 seconds.

27. The method of claim 26, wherein the low dielectric constant layer has an oxygen content of about 6% or less by atomic concentration.

28. The method of claim 17, wherein depositing the passivation layer is performed in situ with depositing the silicon carbide layer.

29. The method of claim 6, wherein modifying a surface of the silicon carbide layer is performed in situ with depositing the silicon carbide layer.

* * * * *